United States Patent
Kasuya et al.

(10) Patent No.: US 10,813,218 B2
(45) Date of Patent: Oct. 20, 2020

(54) RESIN MULTILAYER SUBSTRATE AND ELECTRONIC DEVICE

(71) Applicant: Murata Manufacturing Co., Ltd., Nagaokakyo-shi, Kyoto-fu (JP)

(72) Inventors: Atsushi Kasuya, Nagaokakyo (JP); Yusuke Kamitsubo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/788,426

(22) Filed: Feb. 12, 2020

(65) Prior Publication Data

US 2020/0178391 A1    Jun. 4, 2020

Related U.S. Application Data

(63) Continuation of application No. PCT/JP2018/033644, filed on Sep. 11, 2018.

(30) Foreign Application Priority Data

Sep. 14, 2017  (JP) .................................. 2017-176814

(51) Int. Cl.
*H05K 1/02* (2006.01)
*H05K 1/11* (2006.01)
*H05K 1/05* (2006.01)

(52) U.S. Cl.
CPC .......... *H05K 1/115* (2013.01); *H05K 1/0213* (2013.01); *H05K 1/0298* (2013.01); *H05K 1/05* (2013.01)

(58) Field of Classification Search
CPC ..... H05K 1/0213; H05K 3/4046; H05K 1/113
USPC .......................................................... 174/267
See application file for complete search history.

(56) References Cited

U.S. PATENT DOCUMENTS

| | | |
|---|---|---|
| 6,747,217 B1 | 6/2004 | Jochym et al. |
| 2005/0277282 A1 | 12/2005 | Horikawa et al. |
| 2014/0268618 A1 | 9/2014 | Tokuda |

FOREIGN PATENT DOCUMENTS

| | | |
|---|---|---|
| JP | 2005-353932 A | 12/2005 |
| JP | 2007-208083 A | 8/2007 |
| JP | 2008-016729 A | 1/2008 |
| JP | 2014-049588 A | 3/2014 |
| JP | 2014-146650 A | 8/2014 |
| JP | 2014-183132 A | 9/2014 |
| JP | 2016-062916 A | 4/2016 |

OTHER PUBLICATIONS

Official Communication issued in International Patent Application No. PCT/JP2018/033644, dated Nov. 27, 2018.

*Primary Examiner* — Jeremy C Norris
(74) *Attorney, Agent, or Firm* — Keating & Bennett, LLP

(57) ABSTRACT

A resin multilayer board includes a substrate including a stack of resin layers, and a first metal pin including a first end portion exposed at a first main surface of the substrate and penetrating through at least one of the resin layers in a thickness direction, wherein a gap is provided at a portion of an interface between a lateral side of the first metal pin and the resin layer.

20 Claims, 6 Drawing Sheets

RESIN MULTILAYER SUBSTRATE AND ELECTRONIC DEVICE

CROSS REFERENCE TO RELATED APPLICATIONS

This application claims the benefit of priority to Japanese Patent Application No. 2017-176814 filed on Sep. 14, 2017 and is a Continuation Application of PCT Application No. PCT/JP2018/033644 filed on Sep. 11, 2018. The entire contents of each application are hereby incorporated herein by reference.

BACKGROUND OF THE INVENTION

1. Field of the Invention

The present invention relates to a resin multilayer board and an electronic device.

2. Description of the Related Art

One of known methods of forming an interlayer connection conductor uses a metal pin as disclosed in JP 2008-16729 A, for example.

In the production of resin multilayer boards including a stack of resin layers, the inventors of preferred embodiments of the present invention attempted to form an interlayer connection conductor by forming through-holes in the resin layers and inserting metal pins into the through-holes. Yet, it was discovered that in a resin multilayer board produced by the above method, heating such as reflow may cause breakage of a metal pin or separation of a metal pin at an interface between a lateral side of the metal pin and the resin layer.

It was also discovered that in the resin multilayer board produced by the above method, particularly when an electrode pad is formed on a surface of the board and the electrode pad is connected to an end of a metal pin, heating such as reflow may cause breakage or separation of the electrode pad at a connection portion between the electrode pad and the metal pin.

SUMMARY OF THE INVENTION

Preferred embodiments of the present invention provide resin multilayer boards each having heat resistance to prevent problems, such as breakage of a metal pin during heating, and electronic devices each including a resin multilayer board as an interposer.

A resin multilayer board according to a preferred embodiment of the present invention includes a substrate including a stack of resin layers; and a first metal pin including a first end portion exposed at a first main surface of the substrate and penetrating through at least one of the resin layers in a thickness direction, wherein a gap is provided at a portion of an interface between a lateral side of the first metal pin and the resin layer.

In a resin multilayer board according to a preferred embodiment of the present invention, preferably, the first metal pin includes, at the first end portion, an inclined surface where the conductor width is increased toward the first main surface of the substrate.

In a resin multilayer board according to a preferred embodiment of the present invention, more preferably, the first metal pin includes, in addition to the inclined surface, a straight surface where the conductor width is constant or substantially constant. In this case, the number of gaps provided at the interface between the inclined surface of the first metal pin and the resin layers may be smaller than the number of gaps provided at the interface between the straight surface of the first metal pin and the resin layers.

In a resin multilayer board according to a preferred embodiment of the present invention, the first metal pin may include a second end portion exposed at a second main surface of the substrate, and may penetrate through all of the resin layers in the thickness direction. In this case, preferably, the first metal pin includes, at the second end portion, an inclined surface where the conductor width is increased toward the second main surface of the substrate.

A resin multilayer board according to a preferred embodiment of the present invention may further include a second metal pin penetrating through at least one of the resin layers in the thickness direction, wherein the first metal pin may include a second end portion not exposed at a second main surface of the substrate, the second metal pin may include a first end portion not exposed at the first main surface of the substrate and a second end portion exposed at the second main surface of the substrate, and the first metal pin may be electrically connected to the second metal pin. In this case, preferably, the second metal pin includes, at the second end portion, an inclined surface where the conductor width is increased toward the second main surface of the substrate.

In a resin multilayer board according to a preferred embodiment of the present invention, the first metal pin may include a second end portion exposed at a second main surface of the substrate and penetrate through all of the resin layers in the thickness direction, and the first metal pin may include a straight surface where the conductor width is constant or substantially constant from the first end portion to the second end portion.

A resin multilayer board according to a preferred embodiment of the present invention may further include a second metal pin penetrating through at least one of the resin layers in the thickness direction, wherein the first metal pin may include a second end portion not exposed at a second main surface of the substrate, the second metal pin may include a first end portion not exposed at the first main surface of the substrate and a second end portion exposed at the second main surface of the substrate, the first metal pin may be electrically connected to the second metal pin, and the first metal pin and the second metal pin each may include a straight surface where the conductor width is constant or substantially constant from the first end portion to the second end portion.

In a resin multilayer board according to a preferred embodiment of the present invention, preferably, an oxide of a metal is provided on an outermost surface of the lateral side of the first metal pin, the metal defining the first metal pin.

A resin multilayer board according to a preferred embodiment of the present invention may further include, on the first main surface of the substrate, a first electrode pad connected to the first end portion of the first metal pin.

In a resin multilayer board according to a preferred embodiment of the present invention, preferably, the first metal pin and the first electrode pad include the same metal as a main component, and the first metal pin is connected to the first electrode pad via a bonding layer including, as a main component, a metal different from the above metal.

In a resin multilayer board according to a preferred embodiment of the present invention, preferably, the resin layer is made of a thermoplastic resin.

In a resin multilayer board according to a preferred embodiment of the present invention, preferably, the substrate includes a stack of a resin layer made of a first thermoplastic resin and a resin layer made of a second thermoplastic resin having a higher melting point than the first thermoplastic resin.

In a resin multilayer board according to a preferred embodiment of the present invention, preferably, the first thermoplastic resin is a liquid crystal polymer, and the second thermoplastic resin is a fluorine resin.

Preferably, a resin multilayer board according to a preferred embodiment of the present invention further includes, on the first main surface of the substrate, a first electrode pad connected to the first end portion of the first metal pin, and the resin layer made of the second thermoplastic resin is in contact with the first electrode pad.

An electronic device according to a preferred embodiment of the present invention includes a first circuit board; a second circuit board; and an interposer between the first circuit board and the second circuit board, the interposer including terminals, wherein the interposer is defined by a resin multilayer board according to a preferred embodiment of the present invention, and the first circuit board and the second circuit board are electrically connected to the first metal pin of the resin multilayer board.

Preferred embodiments of the present invention can provide resin multilayer boards each having heat resistance to prevent problems such as breakage of a metal pin during heating.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
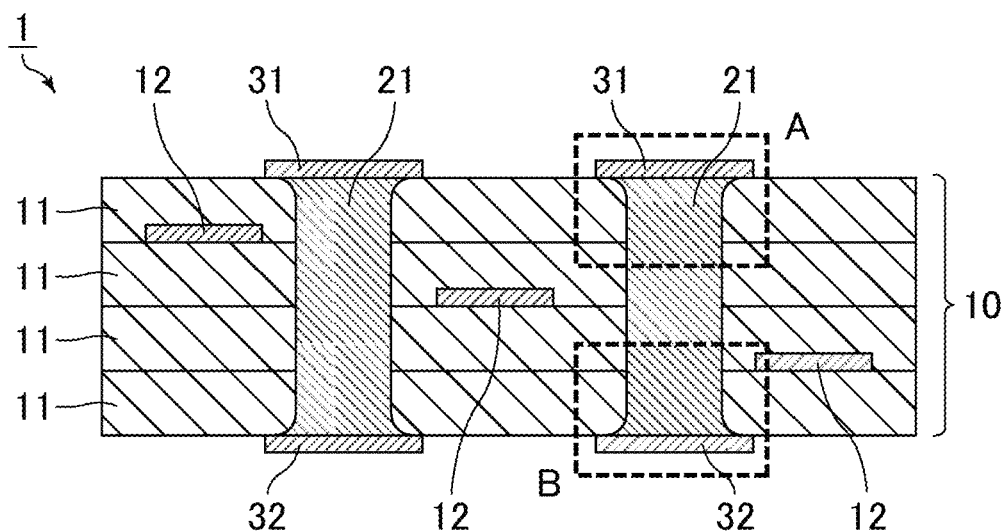
FIG. 1 is a cross-sectional view schematically showing an example of a resin multilayer board according to a preferred embodiment of the present invention.

Hereinafter, descriptions are provided of resin multilayer boards and electronic devices according to preferred embodiments of the present invention with reference to the drawings.

The present invention is not limited to the following preferred embodiments, and may be suitably modified without departing from the gist of the present invention. Combinations of two or more preferred features described in the following preferred embodiments are also within the scope of the present invention.

Resin Multilayer Board

A resin multilayer board according to a preferred embodiment of the present invention includes a substrate including a stack of resin layers, and a first metal pin including a first end portion exposed at a first main surface of the substrate and penetrating through at least one of the resin layers in a thickness direction. In the resin multilayer board of the present preferred embodiment, a gap is provided at a portion of an interface between a lateral side of the first metal pin and the resin layer.

During heating such as reflow, the coefficient of thermal expansion of the resin layer is higher than the coefficient of thermal expansion of the metal pin, so that stress is generated due to the difference in the coefficient of thermal expansion between the metal pin defining and functioning as an interlayer connection conductor and the resin layer. Thus, when the resin layer is adhered to the lateral side of the metal pin without a gap, stress applied to the metal pin tends to cause breakage of the metal pin or separation of the metal pin at an interface between a lateral side of the metal pin and the resin layer. In contrast, when a gap is provided at a portion of the interface between the lateral side of the metal pin and the resin layer, breakage or separation of the metal pin is prevented presumably because the metal pin is less susceptible to stress caused by expansion of the resin layer in the main surface direction during heating.

Additionally, when the resin layer has a higher linear expansion coefficient in the thickness direction than the linear expansion coefficient in the main surface direction (for example, when the resin layer includes a liquid crystal polymer), stress applied to the resin layer is larger in the thickness direction than in the main surface direction. Yet, when a gap is provided, the stress in the thickness direction is easily dissipated.

In a resin multilayer board of a present preferred embodiment, preferably, the first metal pin includes, at the first end portion, an inclined surface where the conductor width is increased toward the first main surface of the substrate.

When the inclined surface is provided at the end portion of the metal pin, presumably, breakage or separation of the metal pin is further prevented because stress applied to the metal pin by expansion of the resin layer in the main surface direction during heating is easily dissipated in the thickness direction of the resin layer.

In particular, when an electrode pad is provided on the surface of the board, and the electrode pad is connected to an end of the metal pin, the inclined surface provided at the end of the metal pin prevents or reduces concentration of stress at a connection portion between the electrode pad and the metal pin, presumably preventing not only breakage or separation of the metal pin but also breakage or separation of the electrode pad.

The above-described advantageous effects resulting from the inclined surface at the end portion of the metal pin is significant when the electrode pad is larger than the metal pin in a plan view of the resin multilayer board seen from the thickness direction of the resin layer.

FIG. 1 is a cross-sectional view schematically showing an example of a resin multilayer board according to a preferred embodiment of the present invention.

A resin multilayer board 1 shown in FIG. 1 includes a substrate 10 including a stack of four resin layers 11, and two first metal pins 21 penetrating through all of the resin layers 11 in a thickness direction (vertical direction in FIG. 1). Predetermined conductive patterns 12 are disposed between the adjacent resin layers 11.

In the resin multilayer board 1 shown in FIG. 1, the first metal pins 21 each include a first end portion exposed at a first main surface of the substrate 10 and a second end portion exposed at a second main surface of the substrate 10. Specifically, the first metal pins 21 penetrate through the substrate 10 from the first main surface to the second main surface.

Further, a first electrode pad 31 is disposed on the first main surface of the substrate 10, and a second electrode pad 32 is disposed on the second main surface of the substrate 10. The first electrode pad 31 is connected to the first end portion of the first metal pin 21, and the second electrode pad 32 is connected to the second end portion of the first metal pin 21.

In a plan view of the resin multilayer board 1 seen from the thickness direction of the resin layers 11, the first electrode pad 31 is larger than the first metal pin 21, and the second electrode pad 32 is larger than the first metal pin 21.

Figure 2A:
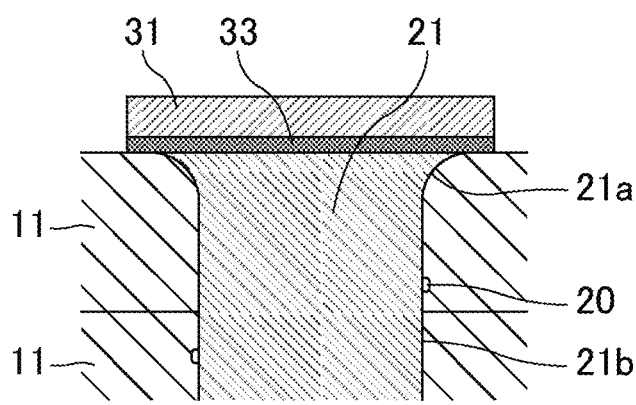
FIG. 2A is an enlarged cross-sectional view schematically showing an example of a portion A of the resin multilayer board shown in FIG. 1.
Figure 2B:
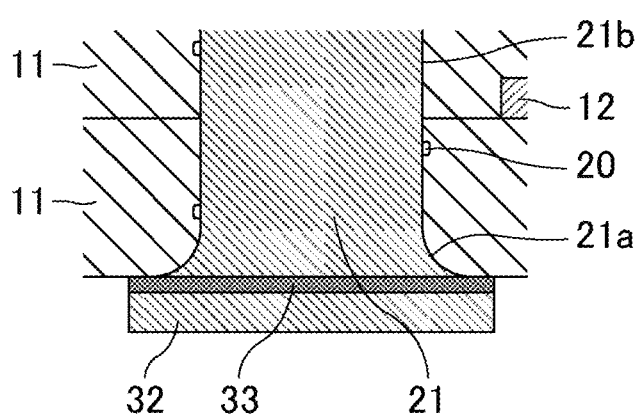
FIG. 2B is an enlarged cross-sectional view schematically showing an example of a portion B of the resin multilayer board shown in FIG. 1.

FIG. 2A is an enlarged cross-sectional view schematically showing of an example of a portion A of the resin multilayer board shown in FIG. 1. FIG. 2B is an enlarged cross-sectional view schematically showing an example of a portion B of the resin multilayer board shown in FIG. 1.

As shown in FIGS. 2A and 2B, multiple gaps 20 are provided at a portion of an interface between the lateral side of the first metal pin 21 and the resin layers 11. FIGS. 2A and 2B schematically show the shape, number, arrangement, and the like of the gaps 20, and the actual shape, number, arrangement, and the like of the gaps 20 are not limited.

As shown in FIG. 2A, the first metal pin 21 includes, at the first end portion, an inclined surface 21a where the conductor width is concavely increased toward the first main surface of the substrate. The first metal pin 21 includes, in addition to the inclined surface 21a, a straight surface 21b where the conductor width is constant or substantially constant. In FIG. 2A, the gaps 20 are provided at an interface between the straight surface 21b of the first metal pin 21 and the resin layers 11, and no gaps 20 are provided at an interface between the inclined surface 21a of the first metal pin 21 and the resin layers 11. Yet, the gaps 20 may be provided also at the interface between the inclined surface 21a of the first metal pin 21 and the resin layers 11.

Further, in FIG. 2A, the first metal pin 21 is connected to the first electrode pad 31 via a bonding layer 33. Yet, the first metal pin 21 may be directly connected to the first electrode pad 31 without the bonding layer 33 therebetween.

As shown in FIG. 2B, the first metal pin 21 includes, at the second end portion, the inclined surface 21a where the conductor width is concavely increased toward the second main surface of the substrate. The first metal pin 21 includes, in addition to the inclined surface 21a, the straight surface 21b where the conductor width is constant or substantially constant. In FIG. 2B, the gaps 20 are provided at an interface between the straight surface 21b of the first metal pin 21 and the resin layers 11, and no gaps 20 are provided at an interface between the inclined surface 21a of the first metal pin 21 and the resin layers 11. Yet, the gaps 20 may be provided also at the interface between the inclined surface 21a of the first metal pin 21 and the resin layers 11.

Further, in FIG. 2B, the first metal pin 21 is connected to the second electrode pad 32 via a bonding layer 33. Yet, the first metal pin 21 may be directly connected to the second electrode pad 32 without the bonding layer 33 therebetween.

Figure 3:
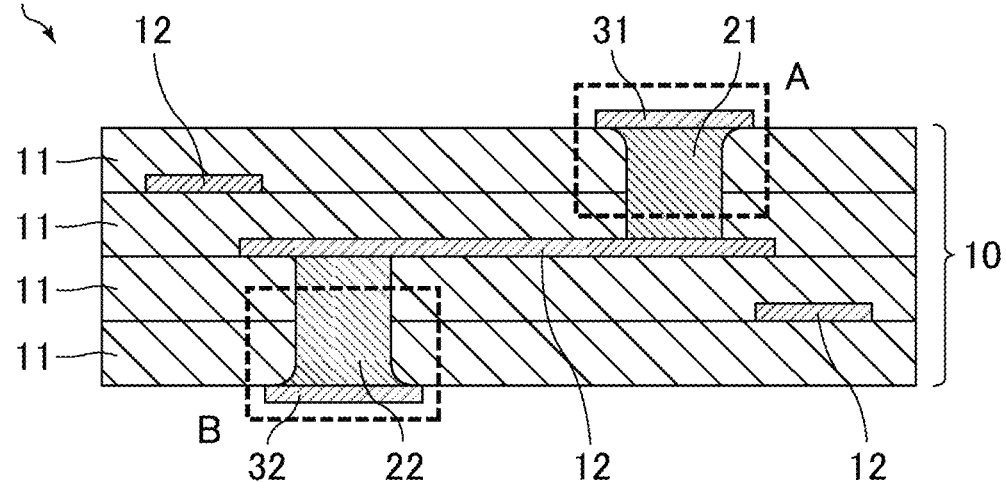
FIG. 3 is a cross-sectional view schematically showing another example of the resin multilayer board of the present invention.

FIG. 3 is a cross-sectional view schematically showing another example of a resin multilayer board according to a preferred embodiment of the present invention.

A resin multilayer board 2 shown in FIG. 3 includes the substrate 10 including a stack of four resin layers 11, one first metal pin 21 penetrating through two resin layers 11 in the thickness direction, and one second metal pin 22 penetrating through two resin layers 11 in the thickness direction. The predetermined conductive patterns 12 are disposed between the adjacent resin layers 11, and the first metal pin 21 is electrically connected to the second metal pin 22.

In the resin multilayer board 2 shown in FIG. 3, the first metal pin 21 includes a first end portion exposed at the first main surface of the substrate 10, and a second end portion not exposed at the second main surface of the substrate 10. In contrast, the second metal pin 22 includes a first end portion not exposed at the first main surface of the substrate 10 and a second end portion exposed at the second main surface of the substrate 10.

Further, the first electrode pad 31 is disposed on the first main surface of the substrate 10, and the second electrode pad 32 is disposed on the second main surface of the substrate 10. The first electrode pad 31 is connected to the first end portion of the first metal pin 21, and the second electrode pad 32 is connected to the second end portion of the second metal pin 22.

The second end portion of the first metal pin 21 and the first end portion of the second metal pin 22 are connected to the conductive pattern 12.

Each metal pin is connected to the conductive pattern, for example, via a bonding layer made of sintered metal formed by applying a paste including Cu and Sn to the metal pin and sintering the paste.

In a plan view of the resin multilayer board 2 seen from the thickness direction of the resin layers 11, the first electrode pad 31 is larger than the first metal pin 21, and the second electrode pad 32 is larger than the second metal pin 22.

Figure 4A:
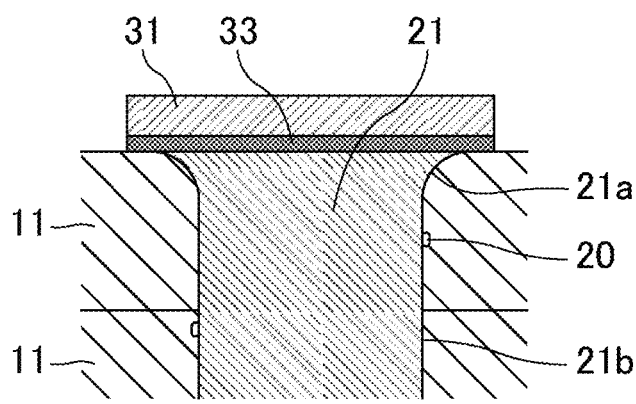
FIG. 4A is an enlarged cross-sectional view schematically showing an example of a portion A of the resin multilayer board shown in FIG. 3.
Figure 4B:
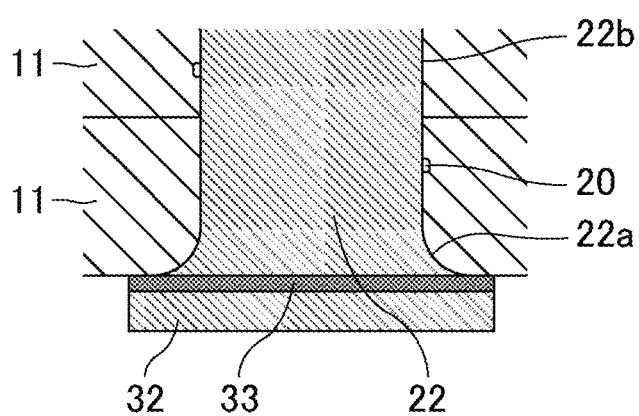
FIG. 4B is an enlarged cross-sectional view schematically showing an example of a portion B of the resin multilayer board shown in FIG. 3.

FIG. 4A is an enlarged cross-sectional view schematically showing an example of a portion A of the resin multilayer board shown in FIG. 3. FIG. 4B is an enlarged cross-sectional view schematically showing an example of a portion B of the resin multilayer board shown in FIG. 3.

As shown in FIGS. 4A and 4B, multiple gaps 20 are provided at a portion of an interface between a lateral side of the first metal pin 21 and the resin layers 11 and at a portion of an interface between a lateral side of the second metal pin 22 and the resin layers 11. FIGS. 4A and 4B schematically show the shape, number, arrangement, and the like of the gaps 20, and the actual shape, number, arrangement, and the like of the gaps 20 are not limited.

The portion A shown in FIG. 4A has the same or substantially the same configuration as that of the portion A shown in FIG. 2A. Thus, a detailed description thereof is omitted.

As shown in FIG. 4B, the second metal pin 22 includes, at the second end portion, an inclined surface 22a where the conductor width is concavely increased toward the second main surface of the substrate. The second metal pin 22 includes, in addition to the inclined surface 22a, a straight surface 22b where the conductor width is constant or substantially constant. In FIG. 4B, the gaps 20 are provided at an interface between the straight surface 22b of the second metal pin 22 and the resin layers 11, and no gaps 20 are provided at the interface between the inclined surface 22a of the second metal pin 22 and the resin layers 11. Yet, the gaps 20 may be provided also at the interface between the inclined surface 22a of the second metal pin 22 and the resin layers 11.

Further, in FIG. 4B, the second metal pin 22 is connected to the second electrode pad 32 via the bonding layer 33. Yet, the second metal pin 22 may be directly connected to the second electrode pad 32 without the bonding layer 33 therebetween.

In the resin multilayer board of the present preferred embodiment, the number of resin layers through which the first metal pin penetrates is not limited as long as the first metal pin includes the first end portion exposed at the first main surface of the substrate. In order to achieve good coplanarity, preferably, the surface at which the first metal pin is exposed is flush or substantially flush with the resin layer.

In the resin multilayer board of the present preferred embodiment, the shape, number, arrangement, and the like of the gaps provided at the interface between the lateral side of the first metal pin and the resin layers is not limited. Yet, when the proportion of gaps provided at the interface is too high, the first metal pin is rendered easily separable from the resin layer. Thus, preferably, the size of the gap in the thickness direction of the resin layer is smaller than the thickness of one resin layer.

In the resin multilayer board of the present preferred embodiment, preferably, an oxide of a metal is provided on an outermost surface of the lateral side of the first metal pin, the metal defining the first metal pin.

In this case, the adhesion between the first metal pin and the resin layers decreases, so that a gap is easily provided at the interface between the lateral side of the first metal pin and the resin layer.

In the resin multilayer board of the present preferred embodiment, preferably, the first metal pin includes, at the first end portion, an inclined surface where the conductor width is increased toward the first main surface of the substrate.

The shape of the inclined surface is not limited, and the region where the inclined surface is provided is also not limited.

More preferably, the first metal pin includes, in addition to the inclined surface, a straight surface where the conductor width is constant or substantially constant.

The conductor width of the straight surface may not be strictly constant, for example, as long as the difference between the minimum conductor width and the maximum conductor width of the straight surface is within about 3%.

In the resin multilayer board of the present preferred embodiment, when the first metal pin includes an inclined surface and a straight surface, the number of gaps provided at the interface between the inclined surface of the first metal pin and the resin layers may be smaller than the number of gaps provided at the interface between the straight surface of the first metal pin and the resin layers. There may also be a case where no gaps are provided at the interface between the inclined surface of the first metal pin and the resin layers.

Even when not many gaps are provided at the interface between the inclined surface of the first metal pin and the resin layers, stress applied to the first end portion of the first metal pin can be dissipated by the shape of the inclined surface.

The resin multilayer board of the present preferred embodiment may further include, on the first main surface of the substrate, a first electrode pad connected to the first end portion of the first metal pin.

When the resin multilayer board of the present preferred embodiment includes the first electrode pad connected to the first end portion of the first metal pin, the method of interconnecting the first metal pin and the first electrode pad is not limited, but preferably, the first metal pin and the first electrode pad include the same metal as a main component, and the first metal pin is connected to the first electrode pad via a bonding layer including, as a main component, a metal different from the above metal.

Herein, the term "main component" refers to a metal element component accounting for the largest proportion (wt %). For example, the main component of the first metal pin and the first electrode pad is preferably Cu, and the main component of the bonding layer is preferably Sn. In this case, at least one of the first metal pin or the first electrode pad may be an alloy including Cu and another metal. The bonding layer may be an alloy including Sn and another metal, for example, an alloy including Sn and Cu.

In the resin multilayer board of the present preferred embodiment, as shown in FIG. 1, each first metal pin may include a second end portion exposed at the second main surface of the substrate, and penetrate through all of the resin layers in the thickness direction. In this case, preferably, the first metal pin includes, at the second end portion, an inclined surface where the conductor width increases toward the second main surface of the substrate.

The shape of the inclined surface provided on the second end portion of the first metal pin may be the same as or different from the shape of the inclined surface provided on the first end portion of the first metal pin.

In the resin multilayer board of the present preferred embodiment, the resin multilayer board may further include, on the second main surface of the substrate, a second electrode pad connected to the second end portion of the first metal pin.

When the resin multilayer board of the present preferred embodiment includes the second electrode pad connected to the second end portion of the first metal pin, the method of interconnecting the first metal pin and the second electrode pad is not limited, but preferably, the first metal pin and the second electrode pad include the same metal as a main component, and the first metal pin is connected to the second electrode pad via a bonding layer including, as a main component, a metal different from the above metal.

As shown in FIG. 3, the resin multilayer board may further include a second metal pin penetrating through at least one of the resin layers in the thickness direction, wherein the first metal pin may include a second end portion not exposed at a second main surface of the substrate, the second metal pin may include a first end portion not exposed at the first main surface of the substrate and a second end portion exposed at the second main surface of the substrate, and the first metal pin may be electrically connected to the second metal pin.

In the resin multilayer board shown in FIG. 3, the number of resin layers through which the second metal pins penetrate is not limited as long as each second metal pin includes the first end portion not exposed at the first main surface of the substrate and the second end portion exposed at the second main surface of the substrate. In order to achieve good coplanarity, preferably, the surface at which the second metal pin is exposed is preferably flush or substantially flush with the resin layer.

In the resin multilayer board 2 shown in FIG. 3, the second end portion of the first metal pin 21 and the first end portion of the second metal pin 22 are positioned at the same or substantially the same level, but the second end portion of the first metal pin and the first end portion of the second metal pin may be positioned at different levels as long as the first metal pin is electrically connected to the second metal pin.

In the resin multilayer board 2 shown in FIG. 3, the second end portion of the first metal pins 21 and the first end portion of the second metal pin 22 do not overlap each other when seen from the thickness direction of the resin layers 11. Yet, the second end portion of the first metal pin and the first end portion of the second metal pin may overlap each other, as long as the first metal pin is electrically connected to the second metal pin.

In the resin multilayer board of the present preferred embodiment, preferably, a gap is provided at a portion of the interface between the lateral side of the second metal pin and the resin layer. The shape, number, arrangement, and the like of the gaps provided at the interface between the lateral side of the second metal pin and the resin layers is not limited. Yet, when the proportion of gaps provided at the interface is too high, the second metal pin is rendered easily separable from the resin layer. Thus, preferably, the size of the gap in the thickness direction of the resin layer is smaller than the thickness of one resin layer.

In the resin multilayer board of the present preferred embodiment, preferably, an oxide of a metal is provided on an outermost surface of the lateral side of the second metal pin, the metal defining the second metal pin.

In the resin multilayer board of the present preferred embodiment, preferably, the second metal pin includes, at the second end portion, an inclined surface where the conductor width is increased toward the second main surface of the substrate.

The shape of the inclined surface is not limited, and the region where the inclined surface is provided is also not limited. The shape of the inclined surface provided on the second end portion of the second metal pin may be the same as or different from the shape of the inclined surface provided on the first end portion of the first metal pin.

More preferably, the second metal pin includes, in addition to the inclined surface, a straight surface where the conductor width is constant.

The conductor width of the straight surface may not be strictly constant, for example, as long as the difference between the minimum conductor width and the maximum conductor width of the straight surface is within about 3%.

In the resin multilayer board of the present preferred embodiment, when the second metal pin includes the inclined surface and the straight surface, the number of gaps provided at the interface between the inclined surface of the second metal pin and the resin layers may be smaller than the number of gaps provided at the interface between the straight surface of the second metal pin and the resin layers. There may also be a case where no gaps are provided at the interface between the inclined surface of the second metal pin and the resin layers.

The resin multilayer board of the present preferred embodiment may further include, on the second main surface of the substrate, a second electrode pad connected to the second end portion of the second metal pin.

When the resin multilayer board includes the second electrode pad connected to the second end portion of the second metal pin, the method of interconnecting the second metal pin and the second electrode pad is not limited, but preferably, the second metal pin and the second electrode pad include the same metal as a main component, and the second metal pin is connected to the second electrode pad via a bonding layer including, as a main component, a metal different from the above metal.

In the resin multilayer board of the present preferred embodiment, the metal pins such as the first metal pin and the second metal pin may each only have a straight surface where the conductor width is constant or substantially constant from the first end portion to the second end portion, without the inclined surface. In this case, the first end portion of the first metal pin may or may not be provided with the first electrode pad. Similarly, the second end portion of the first metal pin or the second metal pin may or may not be provided with the second electrode pad.

When the electrode pad is connected to the end portion of the metal pin without the inclined surface, stress is easily concentrated at a connection portion between the electrode pad and the metal pin. Thus, preferably, a gap is provided at the interface between the resin layer in contact with the electrode pad and the lateral side of the metal pin.

In the resin multilayer board of the present preferred embodiment, the resin layer is preferably made of, for example, an electrically insulating, plate-shaped or film-shaped resin sheet. The resin of the resin sheets may be a thermoplastic resin or a thermosetting resin, for example, but a thermoplastic resin is preferred. Use of a thermoplastic resin sheet allows a stack of resin sheets including a conductive pattern to be collectively compressed by heat treatment. Additionally, the size and the like of gaps to be provided at the interface between the metal pin and the resin layers can be controlled by adjusting pressing conditions (such as temperature and pressure) during collective compression.

Examples of the thermoplastic resin include liquid crystal polymers (LCP), thermoplastic polyimide resins, polyether ether ketone (PEEK) resins, polyphenylene sulfide (PPS) resins, and fluorine resins. Examples of the fluorine resins include polytetrafluoroethylene (PTFE). Of these, liquid crystal polymers (LCP) are preferred.

In the resin multilayer board of the present preferred embodiment, for example, the thickness and the number of resin layers are not limited.

In the resin multilayer board of the present preferred embodiment, the substrate may include a stack of one kind of resin layers or two or more kinds of resin layers.

Figure 5:
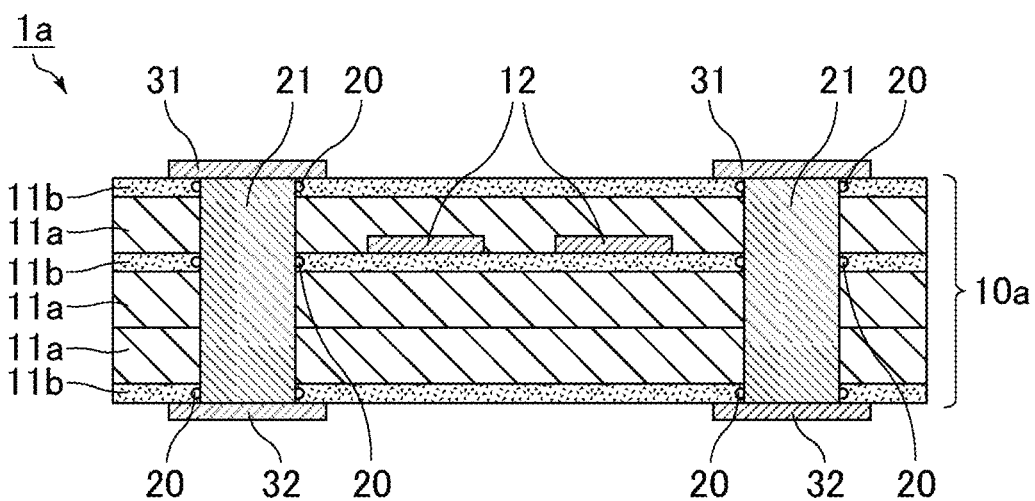
FIG. 5 is a cross-sectional view schematically showing still another example of the resin multilayer board according to a preferred embodiment of the present invention.

FIG. 5 is a cross-sectional view schematically showing still another example of the resin multilayer board according to a preferred embodiment of the present invention.

A resin multilayer board 1a shown in FIG. 5 includes a substrate 10a including a stack of resin layers 11a made of a first resin and resin layers 11b made of a second resin, and two first metal pins 21 penetrating through all of the resin layers 11a and 11b in the thickness direction. The predetermined conductive patterns 12 are disposed between the adjacent resin layers 11a and 11b. The substrate 10a preferably includes, for example, a stack of resin layers made of a first thermoplastic resin and resin layers made of a second thermoplastic resin having a higher melting point than the first thermoplastic resin.

In the resin multilayer board 1a shown in FIG. 5, each first metal pin 21 includes a first end portion exposed at a first main surface of the substrate 10a and a second end portion exposed at a second main surface of the substrate 10a. Specifically, the first metal pins 21 penetrate through the substrate 10a from the first main surface to the second main surface.

Further, the first electrode pad 31 is disposed on the first main surface of the substrate 10a, and a second electrode pad 32 is disposed on the second main surface of the substrate 10a. The first electrode pad 31 is connected to the first end portion of the first metal pins 21, and the second electrode pad 32 is connected to the second end portion of the first metal pins 21. All of the first electrode pads 31 and the second electrode pads 32 are in contact with the resin layers 11b.

In a plan view of the resin multilayer board 1a seen from the thickness direction of the resin layers 11a and 11b, the first electrode pad 31 is larger than the first metal pin 21, and the second electrode pad 32 is larger than the first metal pin 21.

As shown in FIG. 5, multiple gaps 20 are provided at a portion of the interface between the lateral side of each first metal pin 21 and the resin layers 11b. FIG. 5 schematically shows the shape, number, arrangement, and the like of the gaps 20, and the actual shape, number, arrangement, and the like of the gaps 20 are not limited. For example, in FIG. 5, no gaps 20 are provided at the interface between the lateral side of the first metal pin 21 and the resin layers 11a, but the gaps 20 may be provided at a portion of the interface between the lateral side of the first metal pin 21 and the resin layers 11a.

In FIG. 5, each first metal pin 21 does not include an inclined surface at either the first end portion or the second end portion, but may include an inclined surface as shown in FIGS. 2A and 2B.

When the first metal pin 21 does not include an inclined surface, preferably, gaps are provided at the interface between the lateral side of the first metal pin 21 and the resin layer 11b in contact with the first electrode pad 31 or the second electrode pad 32, in such a manner that stress applied to a connection portion between the electrode pad and the metal pin is reduced or prevented.

As shown in FIG. 2A, the first metal pin 21 may be connected to the first electrode pad 31 via the bonding layer 33, or may be directly connected without the bonding layer 33 therebetween. Similarly, as shown in FIG. 2B, the first metal pin 21 may be connected to the second electrode pad 32 via the bonding layer 33, or may be directly connected without the bonding layer 33 therebetween.

In FIG. 5, each first metal pin penetrates through all of the resin layers in the thickness direction as shown in FIG. 1. As shown in FIG. 3, a second metal pin may be disposed, and the first metal pin may be electrically connected to the second metal pin. In this case, the first metal pin may or may not include an inclined surface on the first end portion. Similarly, the second metal pin may or may not include an inclined surface on the second end portion.

When the first metal pin and the second metal pin each do not include an inclined surface, preferably, a gap is provided at the interface between the lateral side of the first metal pin and the resin layer in contact with the first electrode pad and at the interface between the lateral side of the second metal pin and the resin layer in contact with the second electrode pad, in such a manner that stress applied to a connection portion between each electrode pad and each metal pin is reduced or prevented.

In the resin multilayer board of the present preferred embodiment, when the substrate includes a stack of two or more kinds of resin layers, preferably, the substrate includes a stack of a resin layer made of a first thermoplastic resin and a resin layer made of a second thermoplastic resin having a higher melting point than the first thermoplastic resin. In this case, preferably, the first thermoplastic resin is a liquid crystal polymer, and the second thermoplastic resin is a fluorine resin (preferably, PTFE), for example.

The melting point of the resin is a value measured in accordance with differential scanning calorimetry (DSC) defined in JIS K 7121.

As described above, when the resin multilayer board is produced by using resin sheets made of a thermoplastic resin, the resin sheets can be stacked and collectively compressed by heat treatment. Here, the second thermoplastic resin having a higher melting point than the first thermoplastic resin is less likely to flow as compared to the first thermoplastic resin. Thus, presumably, more gaps are provided at the interface between the resin layers made of the second thermoplastic resin and the lateral side of the metal pin than at the interface between the resin layers made of the first thermoplastic resin and the lateral side of the metal pin. This makes it possible to provide gaps at any desired positions through the arrangement of resin layers made of a thermoplastic resin having a high melting point.

In the resin multilayer board of the present preferred embodiment, when the first electrode pad is connected to the first end portion of the first metal pin, the resin layer made of the first thermoplastic resin may be in contact with the first electrode pad, or the resin layer made of the second thermoplastic resin may be in contact with the first electrode pad. In particular, for example, when the first thermoplastic resin is a liquid crystal polymer and the second thermoplastic resin is a fluorine resin, preferably, the resin layer made of the second thermoplastic resin is in contact with the first electrode pad in order to improve high frequency characteristics. As described above, many gaps are provided at the interface between the resin layer made of the second thermoplastic resin and the lateral side of the metal pin, so that the first metal pin may not include an inclined surface at the first end portion.

Similarly, in the resin multilayer board of the present preferred embodiment, when the second electrode pad is connected to the second end portion of the first metal pin or the second metal pin, the resin layer made of the first thermoplastic resin may be in contact with the second electrode pad, or the resin layer made of the second thermoplastic resin may be in contact with the second electrode pad. In particular, when the first thermoplastic resin is a liquid crystal polymer and the second thermoplastic resin is a fluorine resin, for example, preferably, the resin layer made of the second thermoplastic resin is in contact with the second electrode pad in order to improve high frequency characteristics. As described above, many gaps are provided at the interface between the resin layers made of the second thermoplastic resin and the lateral side of the metal pin, so that the first metal pin or the second metal pin may not include an inclined surface at the second end portion.

In addition, when the first thermoplastic resin is a liquid crystal polymer and the second thermoplastic resin is a fluorine resin, for example, preferably, the resin layer made of the second thermoplastic resin is in contact with the conductive pattern in order to improve high frequency characteristics.

In the resin multilayer board of the present preferred embodiment, examples of the metal pins such as the first metal pin include various metal pins made of metal conductors such as copper, gold, silver, aluminum, and alloys including at least one of these metals.

In the resin multilayer board of the present preferred embodiment, the number of metal pins such as the first metal pin is not limited, but preferably, there are multiple metal pins. Additionally, a first metal pin penetrating through the substrate from the first main surface to the second main surface and a first metal pin not penetrating the substrate to the second main surface may be provided in combination.

In the resin multilayer board of the present preferred embodiment, the length, diameter, and the like of the first metal pin or the like are not limited.

Preferably, the resin multilayer board of the present preferred embodiment is produced as follows.

FIGS. 6A to 6G are cross-sectional views schematically showing a non-limiting example of a method of producing the resin multilayer board shown in FIG. 1.

Figure 6A:
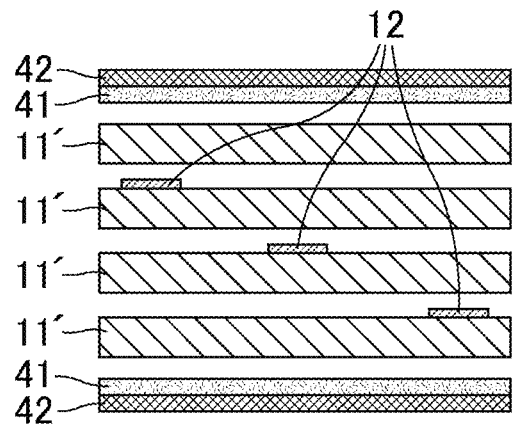
FIGS. 6A to 6G are cross-sectional views schematically showing an example of a method of producing the resin multilayer board shown in FIG. 1.

First, as shown in FIG. 6A, multiple resin sheets 11' made of a thermoplastic resin are stacked. The conductive patterns 12 are formed on surfaces of some specific resin sheets 11'.

The conductive pattern is formed by, for example, providing a resin sheet including metal foil, such as copper foil, attached thereto and patterning the metal foil. Patterning may be performed by a method such as photolithography, for example.

Also, as shown in FIG. 6A, preferably, a resin sheet 41 for surface layers which include metal foil 42 entirely or substantially entirely attached to one main surface of the resin sheet 41 is provided, and the resin sheet 41 for surface layers is disposed on an outermost layer on each side such that the metal foil 42 is disposed on each outermost side. When the metal foil is disposed on the outermost layer, the generation of burrs during the later-described cutting process (spot facing) can be reduced, as compared to the case where the resin sheet is disposed on the outermost layer. The resin sheets 41 for surface layers may not be disposed on the outermost layers.

Figure 6B:
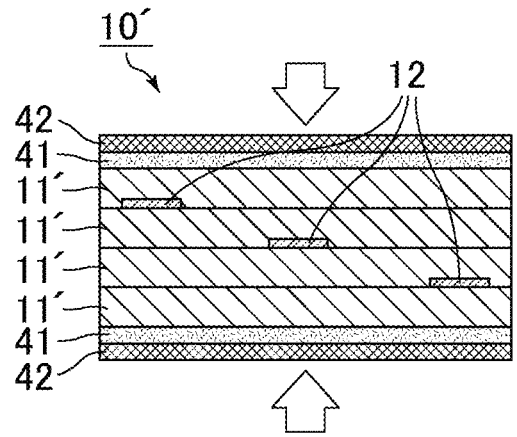

Next, as shown in FIG. 6B, the resin sheets are heated and pressed by lamination press. Consequently, the thermoplastic resin forming the resin sheets 11' is softened and the resin sheets 11' are bonded together, such that a laminate 10' is obtained. This step can be omitted, and holes may be formed in the resin sheets without performing lamination press.

Figure 6C:
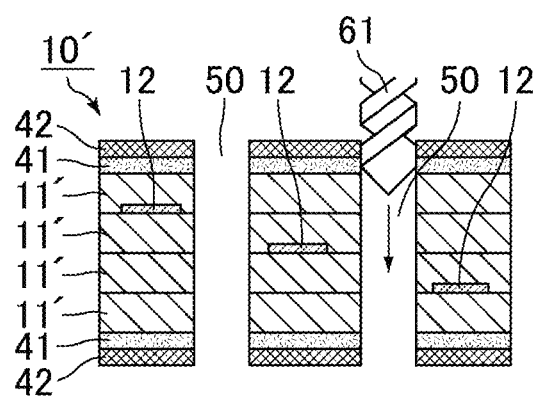
Figure 6D:
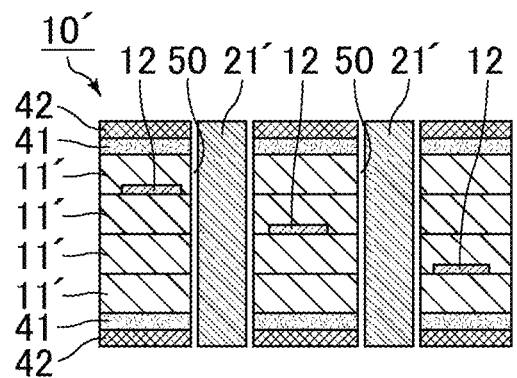

As shown in FIG. 6C, holes 50 are formed in the resulting laminate 10' from a first main surface of the laminate 10' by using a drill 61 or the like at positions where metal pins 21' are to be inserted (see FIG. 6D). In FIG. 6C, the holes 50 penetrating the laminate 10' from the first main surface to a second main surface are formed.

Any method may be used to form holes in the laminate. Examples include drilling and laser processing. Of these, drilling is preferred. With drilling, holes can be easily formed even when the laminate is thick, and holes each having a constant diameter can be formed.

As shown in FIG. 6D, the metal pins 21', such as a copper pin, for example, are inserted into the holes 50 formed in the laminate 10'. The diameter of each metal pin 21' is preferably slightly smaller than the diameter of the hole 50. In FIG. 6D, the metal pins 21' each include one end exposed at the first main surface of the laminate 10' and the other end exposed at the second main surface of the laminate 10', and these metal pins 21' having such a length are inserted.

Figure 6E:
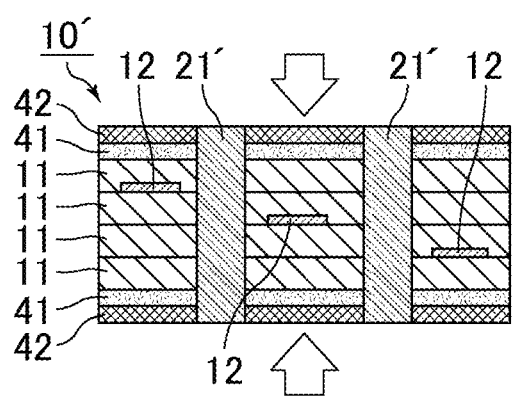

As shown in FIG. 6E, the laminate 10' into which the metal pins 21' are inserted are heated and pressed by lamination press.

Consequently, the thermoplastic resin forming the resin sheets 11' is softened, so that a large portion of the resin sheets 11' is adhered to the metal pins 21', such that the resin sheets 11' turn into the resin layers 11. Meanwhile, usually, fine projections and depressions are formed on a surface of the metal pin 21'. Thus, at the interface between the lateral side of the metal pin 21' and the resin layers 11, there is a portion where the flow of the softened thermoplastic resin cannot completely follow the projections and depressions on the metal pin 21'. In other words, some of the depressions in the metal pin 21' are not filled with the resin, and these portions define gaps. This presumably results in gaps (see FIGS. 2A and 2B) at a portion of the interface between the lateral side of the metal pin 21' and the resin layers 11.

The size and the like of gaps to be formed at the interface between the lateral side of the metal pin and the resin layer can be controlled by adjusting the shape and the like of projections and depressions formed on the surface of the metal pin. The size and the like of gaps to be formed at the interface between the lateral side of the metal pin and the resin layers can also be controlled by adjusting the pressing conditions (such as temperature and pressure).

Figure 6F:
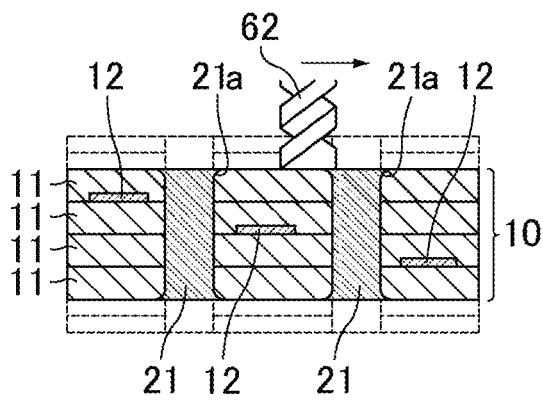

Subsequently, as shown in FIG. 6F, a cutting tool such as a router 62 is used to perform a cutting process (spot facing) on the surface of the laminate 10' after lamination press.

In FIG. 6F, the resin sheets 41 for surface layers which includes the metal foil 42 attached thereto are removed from the laminate 10', and the remaining portion is obtained as the substrate 10. With the cutting process, the metal pins can all have the same or substantially the same height, and the surface at which the metal pin is exposed and the resin layers can be flattened.

Additionally, with the cutting process, the inclined surface 21a can be formed at an end portion of each metal pin 21', such that the first metal pins 21 can be obtained, as shown in FIG. 6F.

While the metal pin having higher strength than the metal foil is more resistant to cutting, the resin layer is softer than the metal pin. Thus, the metal pin is deformed in the cutting direction when a cutting tool such as a router is moved. This presumably results in an inclined surface at the end portion of the metal pin.

Any method may be used to perform the cutting process. Examples include routing and grinding. Of these, routing is preferred. With routing, the cutting speed can be more easily controlled as compared to grinding, so that the cutting shape of the metal pin can be easily controlled. Thus, the inclined surface can be easily formed.

In FIG. 6F, the cutting process is performed on both the first main surface and the second main surface of the laminate 10', but it is sufficient as long as the cutting process is performed on at least the first main surface of the laminate 10'.

Figure 6G:
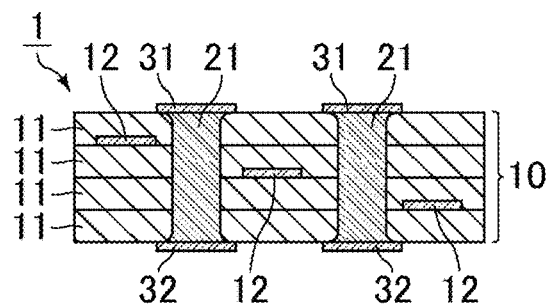

Subsequently, as shown in FIG. 6G, the first electrode pad 31 is formed on the first main surface of the substrate 10, and the second electrode pad 32 is formed on the second main surface of the substrate 10. As a result, the resin multilayer board 1 is obtained.

The first electrode pad and the second electrode pad are formed by plaiting, for example, by using a metal pin as a base electrode.

When producing the resin multilayer board shown in FIG. 5, preferably, a laminate is produced by using a resin sheet made of the first thermoplastic resin and a resin sheet made of the second thermoplastic resin having a melting point higher than the first thermoplastic resin. When the laminate is subjected to lamination pressing, the second thermoplastic resin having a higher melting point than the first thermoplastic resin is less likely to flow as compared to the first thermoplastic resin. Thus, presumably, more gaps are formed at the interface between the resin layer made of the second thermoplastic resin and the lateral side of the metal pin than at the interface between the resin layer made of the first thermoplastic resin and the lateral side of the metal pin.

Electronic Device

Preferably, the resin multilayer boards according to preferred embodiments of the present invention are used as interposers.

In particular, an electronic device according to a preferred embodiment of the present invention includes a first circuit board, a second circuit board, and an interposer between the first circuit board and the second circuit board, the interposer including multiple terminals, wherein the interposer is defined by a resin multilayer board according to a preferred embodiment of the present invention, and the first circuit board and the second circuit board are electrically connected to the first metal pin of the resin multilayer board.

Figure 7:
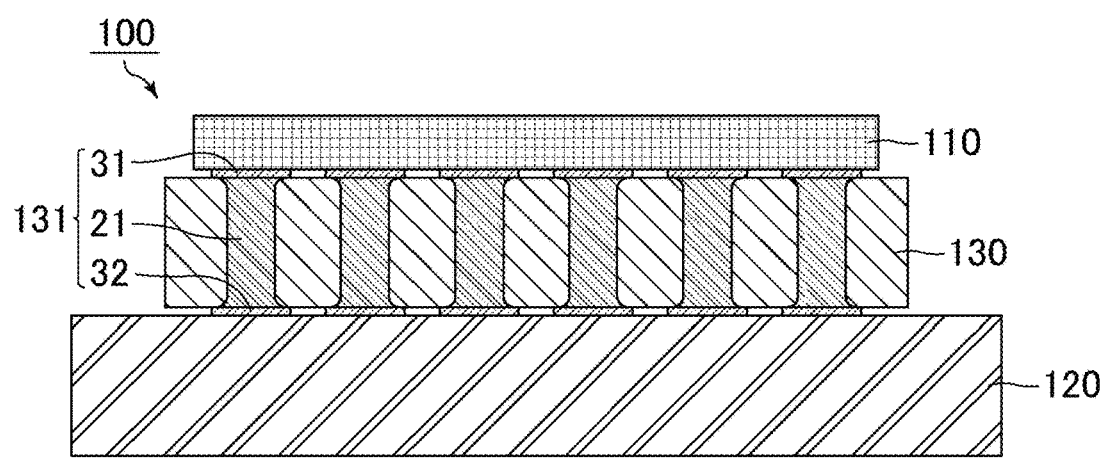
FIG. 7 is a cross-sectional view schematically showing an example of an electronic device according to a preferred embodiment of the present invention.

FIG. 7 is a cross-sectional view schematically showing an example of an electronic device according to a preferred embodiment of the present invention.

An electronic device 100 shown in FIG. 7 includes a first circuit board 110, a second circuit board 120, and an interposer 130 between the first circuit board 110 and the second circuit board 120, the interposer 130 including multiple terminals 131.

In the electronic device 100 shown in FIG. 7, a resin multilayer board having a similar structure to that of the resin multilayer board 1 shown in FIG. 1 is used as the interposer 130, and the terminals 131 are defined by the first metal pin 21, the first electrode pad 31, and the second electrode pad 32.

The first circuit board 110 and the second circuit board 120 are electrically connected to the first metal pins 21 of the resin multilayer board. Specifically, the first circuit board 110 is electrically connected to the first electrode pad 31, and the second circuit board 120 is electrically connected to the second electrode pad 32.

Figure 8:
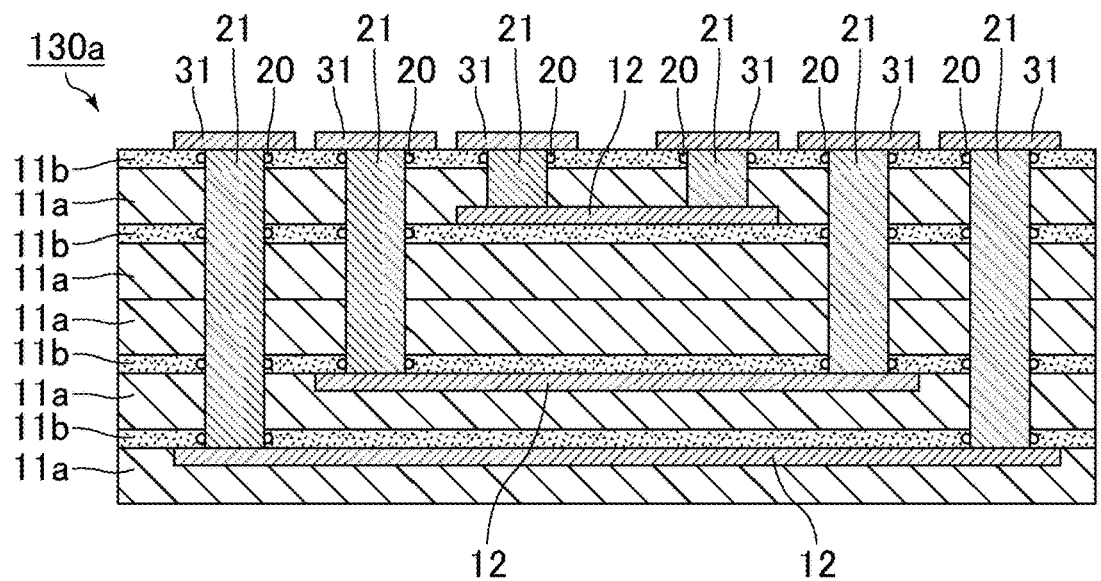
FIG. 8 is a cross-sectional view schematically showing an example of an interposer defining an electronic device according to a preferred embodiment of the present invention.

FIG. 8 is a cross-sectional view schematically showing an example of an interposer defining an electronic device according to a preferred embodiment of the present invention.

Similar to the resin multilayer board 1a shown in FIG. 5, an interposer 130a shown in FIG. 8 includes a stack of the resin layers 11a made of a first resin and the resin layers 11b made of a second resin. For example, preferably, the stack includes resin layers made of a first thermoplastic resin and resin layers made of a second thermoplastic resin having a higher melting point than the first thermoplastic resin.

Figure 9:
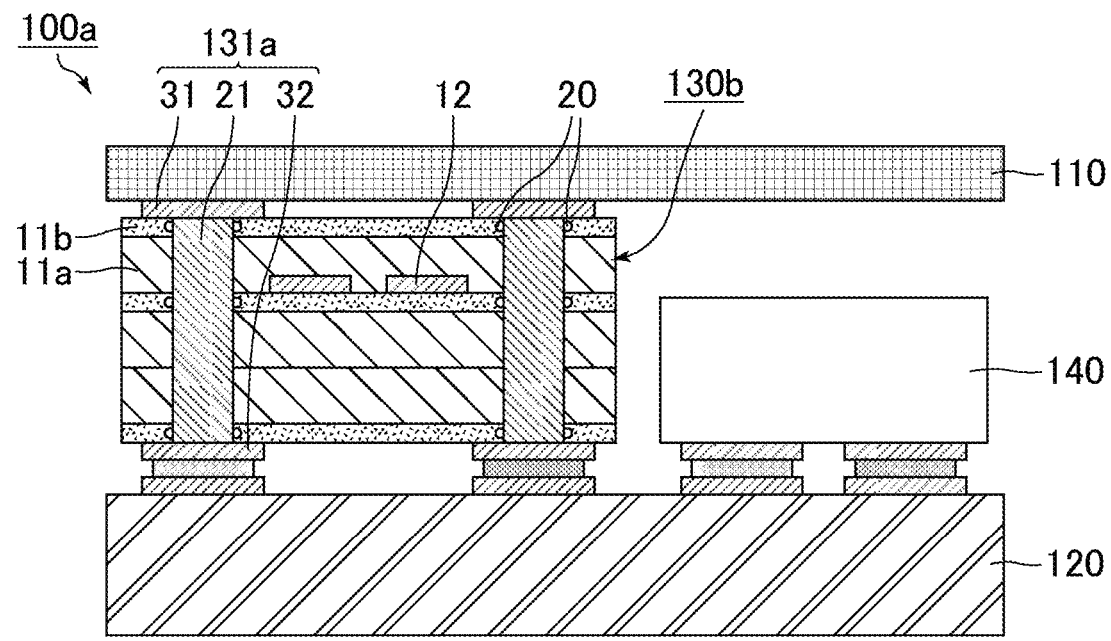
FIG. 9 is a cross-sectional view schematically showing another example of an electronic device according to a preferred embodiment of the present invention.

FIG. 9 is a cross-sectional view schematically showing another example of an electronic device according to a preferred embodiment of the present invention.

An electronic device 100a shown in FIG. 9 includes the first circuit board 110, the second circuit board 120, and an interposer 130b between the first circuit board 110 and the second circuit board 120, the interposer 130b including multiple terminals 131a. An electronic component 140 is mounted on a surface of the second circuit board 120, and the interposer 130b is disposed to avoid contact with the electronic component 140.

Similar to the interposer 130a shown in FIG. 8, the electronic device 100a shown in FIG. 9 includes, as the interposer 130b, a resin multilayer board including a stack of the resin layers 11a made of the first resin and the resin layers 11b made of the second resin, and the terminals 131a are defined by the first metal pins 21, the first electrode pads 31, and the second electrode pads 32.

The resin multilayer boards and the electronic devices according to preferred embodiments of the present invention are not limited to the above preferred embodiments, and various modifications and changes may be made to the configuration, production conditions, and the like of the resin multilayer boards, within the scope of the present invention.

For example, the resin multilayer board 1 shown in FIG. 1, the resin multilayer board 2 shown in FIG. 3, and the resin multilayer board 1a shown in FIG. 5 may not include the first electrode pads 31 or the second electrode pads 32.

In the resin multilayer board 1 shown in FIG. 1, each first metal pin 21 may not include the inclined surface 21a. Similarly, in the resin multilayer board 2 shown in FIG. 3, the first metal pin 21 may not include the inclined surface 21a, and the second metal pin 22 may not include the inclined surface 22a. Additionally, in the resin multilayer board 1a shown in FIG. 5, each first metal pin may include the inclined surface. Also in the above cases, the first electrode pads 31 and the second electrode pads 32 may not be provided.

In the resin multilayer boards according to preferred embodiments of the present invention, the shape of the inclined surface is not limited to the shape in which the conductor width is concavely increased. The inclined surface may include a flat surface or a curved surface. Further, the inclined surface may include one or more constrictions. When the inclined surface includes a curved surface, the conductor width may be concavely or convexly increased. Additionally, when the inclined surface includes a curved surface, the curvature of the inclined surface may be constant or varying.

While the above has described the resin multilayer board in which gaps are provided at a portion of the interface between the lateral side of the first metal pin and the resin layer, preferred embodiments of the present invention also encompass a resin multilayer board and an electronic device described below.

A resin multilayer board according to a preferred embodiment of the present invention includes a substrate including a stack of multiple resin layers, and a first metal pin including a first end portion exposed at a first main surface of the substrate and penetrating through at least one of the resin layers in a thickness direction, wherein the first metal pin includes, at the first end portion, an inclined surface where the conductor width is increased toward the first main surface of the substrate.

In a resin multilayer board according to a preferred embodiment of the present invention, the first metal pin includes, in addition to the inclined surface, a straight surface where the conductor width is constant or substantially constant.

In a resin multilayer board according to a preferred embodiment of the present invention, the number of gaps provided at the interface between the inclined surface of the first metal pin and the resin layers is smaller than the number of gaps provided at the interface between the straight surface of the first metal pin and the resin layers.

A resin multilayer board according to a preferred embodiment of the present invention further includes, on the first main surface of the substrate, a first electrode pad connected to the first end portion of the first metal pin.

In a resin multilayer board according to a preferred embodiment of the present invention, the first metal pin and the first electrode pad include the same metal as a main component, and the first metal pin is connected to the first electrode pad via a bonding layer including, as a main component, a metal different from the above metal.

In a resin multilayer board according to a preferred embodiment of the present invention, the first metal pin includes a second end portion exposed at a second main surface of the substrate, and penetrates through all of the resin layers in the thickness direction.

In a resin multilayer board according to a preferred embodiment of the present invention, the first metal pin includes, at the second end portion, an inclined surface where the conductor width is increased toward the second main surface of the substrate.

A resin multilayer board according to a preferred embodiment of the present invention further includes, on the second main surface of the substrate, a second electrode pad connected to the second end portion of the first metal pin.

A resin multilayer board according to a preferred embodiment of the present invention further includes a second metal pin penetrating through at least one of the resin layers in the thickness direction, wherein the first metal pin includes a second end portion not exposed at a second main surface of the substrate, the second metal pin includes a first end portion not exposed at the first main surface of the substrate, and a second end portion exposed at the second main surface of the substrate, and the first metal pin is electrically connected to the second metal pin.

In a resin multilayer board according to a preferred embodiment of the present invention, the second metal pin includes, at the second end portion, an inclined surface where the conductor width is increased toward the second main surface of the substrate.

A resin multilayer board according to a preferred embodiment of the present invention further includes, on the second main surface of the substrate, a second electrode pad connected to the second end portion of the second metal pin.

In a resin multilayer board according to a preferred embodiment of the present invention, the resin layer is made of a thermoplastic resin.

In a resin multilayer board according to a preferred embodiment of the present invention, the substrate includes a stack of a resin layer made of a first thermoplastic resin and a resin layer made of a second thermoplastic resin having a higher melting point than the first thermoplastic resin.

In a resin multilayer board according to a preferred embodiment of the present invention, the first thermoplastic resin is a liquid crystal polymer, and the second thermoplastic resin is a fluorine resin.

A resin multilayer board according to a preferred embodiment of the present invention further includes on the first main surface of the substrate, a first electrode pad connected to the first end portion of the first metal pin, wherein a resin layer made of the second thermoplastic resin is in contact with the first electrode pad.

An electronic device according to a preferred embodiment of the present invention includes a first circuit board, a second circuit board, and an interposer between the first circuit board and the second circuit board, the interposer including multiple terminals, wherein the interposer is defined by a resin multilayer board according to a preferred embodiment of the present invention, and the first circuit board and the second circuit board are electrically connected to the first metal pin of the resin multilayer board.

EXAMPLES

The following describes examples that more specifically disclose preferred embodiments of the present invention. The present invention is not limited to these examples.

Four resin sheets (thickness: about 500 μm, for example) made of a liquid crystal polymer were provided as resin sheets that turn into resin layers. In the present example, four resin sheets not including copper foil attached thereto were provided in order to produce a resin multilayer board without conductive patterns on inner layers. Separately, two resin sheets (thickness: about 25 μm, for example) made of a liquid crystal polymer, including copper foil (thickness: about 12 μm, for example) entirely or substantially entirely attached to one main surface thereof were provided as resin sheets for surface layers.

The resin sheets that turn into resin layers were stacked, and the resin sheets for surface layers were disposed on the outermost layers such that the copper foil was disposed on each outermost side. Then, lamination pressing was performed, such that a laminate was obtained. Lamination pressing was performed using a 1.8-mm thick intermediate frame plate at a temperature of about 310° C.

Holes penetrating the laminate from a first main surface to a second main surface were formed using a drilling machine (ND-1S211 available from Via Mechanics, Ltd.). The processing conditions were as follows.

Processing Conditions

Drill model: V077WU available from Union Tool Co.
Entry board: LE sheet
Drill diameter: about ϕ0.25 mm
Spindle speed: about 100 krpm
Z feed speed: about 0.8 mm/min
Deep drilling: with steps Using tweezers, copper pins (Fine Techno Co., Ltd.; diameter of the pin: about ϕ0.2 mm; length: about 2.0 mm, for example) were inserted into the holes. 600 copper pins in total for 5 pieces were inserted into the holes. The copper pins were easily inserted because the diameter of the each hole was larger than the diameter of each pin by about 50 μm, for example.

Lamination pressing was performed under the same or substantially the same conditions as described above in order to adhere the copper pins to the resin sheets. Since the liquid crystal polymer is a thermoplastic resin, the resin sheets were deformed by the lamination pressing, and the copper pins were securely fixed.

In order to align the height of the copper pins and flatten the surface, a cutting process (spot facing) was performed on both surfaces of the laminate by using a router (ProtoMat S103 available from LPKF). The cutting process was performed such that the processed region gradually increases to form a quadrangular shape from the center of the laminate. The processing conditions are as follows. The surface roughness Sa after the cutting process was about 1.5 μm, for example.

Processing Conditions

Router: SI series available from Union Tool Co.
End mill diameter: about ϕ3.0 mm
Effective blade length: about 6.0 mm
Rotation speed: about 60 krpm XY feed speed: about 15 mm/s Milling depth: about 100 μm Subsequently, contour routing was performed using the router to obtain individual pieces, such that samples for evaluation were obtained.

Appearance Evaluation

The appearance of the sample for evaluation was visually observed, and it was discovered that a copper pin remained at a predetermined position without being displaced even after pressing.

When a cross section of the sample for evaluation was observed using an electronic microscope, a gap was observed at a portion of the interface between a lateral side of the copper pin and the resin layers, and an inclined surface was observed on both end portions of the copper pin. The copper pin was not deformed outside the inclined surface, and no adhesion defect occurred between the copper pin and the resin layers.

Heat Resistance Evaluation

In order to evaluate the heat resistance during reflow, a heat resistance test was performed by heating the sample for evaluation at about 260° C. 5 times or 10 or times. After the test, a cross section of the sample for evaluation was observed. No breakage occurred in the copper pin, and no delamination was found between the copper pin and the resin layers.

Based on the above results, the resin multilayer boards according to preferred embodiments of the present invention are considered to have sufficient heat resistance against heating such as reflow or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer board comprising:
   a substrate including a stack of resin layers; and
   a first metal pin including a first end portion exposed at a first main surface of the substrate and penetrating through at least one of the resin layers in a thickness direction; wherein
   a gap is provided at a portion of an interface between a lateral side of the first metal pin and the resin layer; and
   an oxide of a metal is provided on an outermost surface of the lateral side of the first metal pin, the metal defining the first metal pin.

2. The resin multilayer board according to claim 1, wherein the first metal pin includes, at the first end portion, an inclined surface where a conductor width is increased toward the first main surface of the substrate.

3. The resin multilayer board according to claim 2, wherein the first metal pin includes, in addition to the inclined surface, a straight surface where the conductor width is constant or substantially constant.

4. The resin multilayer board according to claim 3, wherein a number of the gaps provided at the interface between the inclined surface of the first metal pin and the resin layers is smaller than a number of the gaps provided at the interface between the straight surface of the first metal pin and the resin layers.

5. The resin multilayer board according to claim 1, wherein the first metal pin includes a second end portion exposed at a second main surface of the substrate, and penetrates through all of the resin layers in the thickness direction.

6. The resin multilayer board according to claim 5, wherein the first metal pin includes, at the second end portion, an inclined surface where a conductor width is increased toward the second main surface of the substrate.

7. The resin multilayer board according to claim 1, further comprising:
   a second metal pin penetrating through at least one of the resin layers in the thickness direction; wherein
   the first metal pin includes a second end portion not exposed at a second main surface of the substrate;
   the second metal pin includes a first end portion not exposed at the first main surface of the substrate and a second end portion exposed at the second main surface of the substrate; and
   the first metal pin is electrically connected to the second metal pin.

8. The resin multilayer board according to claim 7, wherein the second metal pin includes, at the second end portion, an inclined surface where a conductor width is increased toward the second main surface of the substrate.

9. The resin multilayer board according to claim 1, wherein
   the first metal pin includes a second end portion exposed at a second main surface of the substrate, and penetrates through all of the resin layers in the thickness direction; and
   the first metal pin includes a straight surface where a conductor width is constant or substantially constant from the first end portion to the second end portion.

10. The resin multilayer board according to claim 1, further comprising:
    a second metal pin penetrating through at least one of the resin layers in the thickness direction; wherein
    the first metal pin includes a second end portion not exposed at a second main surface of the substrate;
    the second metal pin includes a first end portion not exposed at the first main surface of the substrate and a second end portion exposed at the second main surface of the substrate;
    the first metal pin is electrically connected to the second metal pin; and
    the first metal pin and the second metal pin each include a straight surface where a conductor width is constant or substantially constant from the first end portion to the second end portion.

11. The resin multilayer board according to claim 1, further comprising, on the first main surface of the substrate, a first electrode pad connected to the first end portion of the first metal pin.

12. The resin multilayer board according to claim 11, wherein the first metal pin and the first electrode pad include a same metal as a main component, and the first metal pin is connected to the first electrode pad via a bonding layer including, as a main component, a metal different from the metal included as a main component in the first metal pin and the first electrode pad.

13. The resin multilayer board according to claim 1, wherein the resin layer is made of a thermoplastic resin.

14. The resin multilayer board according to claim 1, wherein the substrate includes a stack of a resin layer made of a first thermoplastic resin and a resin layer made of a second thermoplastic resin having a higher melting point than the first thermoplastic resin.

15. The resin multilayer board according to claim 14, wherein the first thermoplastic resin is a liquid crystal polymer, and the second thermoplastic resin is a fluorine resin.

16. The resin multilayer board according to claim 15, further comprising:
- on the first main surface of the substrate, a first electrode pad connected to the first end portion of the first metal pin; wherein
- the resin layer made of the second thermoplastic resin is in contact with the first electrode pad.

17. An electronic device comprising:
- a first circuit board;
- a second circuit board; and
- an interposer between the first circuit board and the second circuit board, the interposer including multiple terminals; wherein
- the interposer is defined by the resin multilayer board according to claim 1; and
- the first circuit board and the second circuit board are electrically connected to the first metal pin of the resin multilayer board.

18. The electronic device according to claim 17, wherein the first metal pin includes, at the first end portion, an inclined surface where a conductor width is increased toward the first main surface of the substrate.

19. The electronic device according to claim 18, wherein the first metal pin includes, in addition to the inclined surface, a straight surface where the conductor width is constant or substantially constant.

20. The electronic device according to claim 17, wherein the first metal pin includes a second end portion exposed at a second main surface of the substrate, and penetrates through all of the resin layers in the thickness direction.

* * * * *